(12) United States Patent
Hau-Riege et al.

(10) Patent No.: US 6,768,323 B1
(45) Date of Patent: Jul. 27, 2004

(54) SYSTEM AND METHOD FOR DETERMINING LOCATION OF EXTRUSION IN INTERCONNECT

(75) Inventors: Christine Hau-Riege, Fremont, CA (US); Stefan Hau-Riege, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 37 days.

(21) Appl. No.: 10/283,463

(22) Filed: Oct. 30, 2002

(51) Int. Cl.[7] .................. G01R 31/26; G01R 27/08
(52) U.S. Cl. .................. 324/719; 324/699; 324/696
(58) Field of Search ................ 324/719, 713, 324/696, 699, 763, 755, 537; 438/11, 18, 637

(56) References Cited

U.S. PATENT DOCUMENTS 5,264,377 A * 11/1993 Chesire et al. ............. 438/11
6,320,391 B1 * 11/2001 Bui .......................... 324/537
6,686,273 B2 * 2/2004 Hsu et al. .................. 438/638

OTHER PUBLICATIONS

Hess et al. "Modeling of test structures for efficient online defect monitoring using a digital tester" (Proc. IEEE 1994, Intl Conference on Microelectronic Test Structure, vol. 7, Mar. 1994).*

* cited by examiner

Primary Examiner—Anjan K. Deb
(74) Attorney, Agent, or Firm—Monica H. Choi

(57) ABSTRACT

For locating an extrusion from an interconnect, an extrusion monitor structure is formed to surround the interconnect and is separated from the interconnect by a dielectric material. A first via is coupled to the interconnect, and a second via is coupled to the extrusion monitor structure and separated from the first via by a via distance ($L_v$). The extrusion is located at an extrusion site distance ($L_{extrusion}$) from the first via and between the first and second vias to short-circuit the interconnect to the extrusion monitor structure. A resistance ($R_{total}$) between the first and second vias is measured, and the $L_{extrusion}$ is determined from a relationship with $R_{total}$, $L_v$, and resistivities and dimensions of the interconnect and the extrusion monitor structure.

20 Claims, 8 Drawing Sheets

SYSTEM AND METHOD FOR DETERMINING LOCATION OF EXTRUSION IN INTERCONNECT

TECHNICAL FIELD

The present invention relates generally to interconnect technology in integrated circuit fabrication, and more particularly, to a system and method for electrically determining the location of an extrusion site along a length of an interconnect.

BACKGROUND OF THE INVENTION

Referring to FIG. 1, common components of a monolithic IC (integrated circuit) include interconnect structures such as a first metal line 102 and a second metal line 104. FIG. 2 shows a cross-sectional view of the first and second metal lines 102 and 104 along line I—I of FIG. 1 formed to be surrounded by dielectric material 106 on a semiconductor substrate 108. Interconnect structures are formed to electrically connect integrated circuit devices formed on the semiconductor substrate 108 as known to one of ordinary skill in the art of integrated circuit fabrication.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As IC dimensions are scaled down, the width of the metal lines 102 and 104 are scaled down, and the distance between the metal lines 102 and 104 is decreased as the density of the locations of the interconnect structures is increased for connecting the IC devices having scaled down dimensions. Referring to FIG. 3, as the width of the metal lines 102 and 104 is scaled down, the current density through the metal lines 102 and 104 is increased. With higher current density, the metal lines 102 and 104 exhibit a higher rate of electromigration failure from flux divergence, as known to one of ordinary skill in the art of integrated circuit fabrication. For example, an extrusion 110 of metal material from the first metal line 102 may reach the second metal line 104 to undesirably short-circuit the two metal lines 102 and 104.

Occurrence of such an extrusion 110 is even more probable in current interconnect technology where the metal lines 102 and 104 are comprised of copper surrounded by material 106 that is a low-K dielectric (i.e., a dielectric material having a dielectric constant lower than that of silicon dioxide S102). The low-K dielectric material 106 is advantageous for lower capacitance between the interconnect structures as the distance between the metal lines 102 and 104 is decreased. Such lower capacitance results in higher speed performance of the integrated circuit and also in lower power dissipation.

In addition, such lower capacitance results in lower cross-talk between the interconnect structures. Lower cross-talk between interconnect structures is especially advantageous when the interconnect structures are disposed closer together as device density continually increases. However, the dielectric material 106 with low-K typically is softer (i.e., has lower density) and may even be porous. Thus, the undesired extrusion 110 is especially more likely to occur with such low-K dielectric material 106.

In addition, as device dimensions are further scaled down, a diffusion barrier layer material is formed to be thinner when surrounding interconnect having scaled down dimensions for minimizing resistance of the interconnect. However, a thinner diffusion barrier layer material surrounding the interconnect results in a higher probability of the occurrence of an extrusion from such interconnect.

During characterization of an integrated circuit fabrication process, the location of the extrusion 110 along the length of any of the metal lines 102 or 104 is desired to be determined. Referring to FIGS. 4 and 5, in the prior art, when the extrusion 110 is disposed below the top surface of the surrounding dielectric material 106, the top surface of the materials on the semiconductor substrate 108 is polished down until the extrusion 110 is exposed. Then, the polished top surface is inspected using microscopy tools to visually locate the extrusion 110.

Such a prior art technique for locating the extrusion 110 is disadvantageous because the top surface of the materials on the semiconductor substrate 108 may not be polished down enough (as illustrated in FIG. 6) or may be polished down too much (as illustrated in FIG. 7). In those cases, the extrusion 110 would not be detected visually. In addition, it is difficult to polish down the proper amount of material until the extrusion is exposed to be detected visually since the location of the extrusion is not known a priori. Furthermore, visually determining the location of the extrusion 110 by scanning the entire top surface of materials on the semiconductor substrate 106 using microscopy tools is tedious and time-consuming.

Nevertheless, during characterization of an integrated circuit fabrication process, the location of the extrusion 110 along the length of any of the metal lines 102 or 104 is desired to be determined. Thus, a mechanism is desired for determining the location of an extrusion along the length of a metal line in an easy and accurate manner.

SUMMARY OF THE INVENTION

Accordingly, in a general aspect of the present invention, a system and method determines the location of an extrusion site along a length of an interconnect electrically in an easy and accurate manner.

In one embodiment of the present invention, in a system and method for determining a location of an extrusion site along a length of an interconnect having a width ($w_i$), a resistivity ($\rho_i$), and a height ($h_i$), an extrusion monitor structure having a width ($w_m$), a resistivity ($\rho_m$), and a height ($h_m$), surrounds the sides of the interconnect along the length of the interconnect. The width ($w_m$) of the extrusion monitor structure is larger than the width ($w_i$) of the interconnect. The interconnect and the surrounding extrusion monitor structure are separated by a dielectric material. A first via is coupled to the interconnect at a first via location, and a second via is coupled to the extrusion monitor structure at a second via location. The first via and the second via are separated by a via distance ($L_v$), and the extrusion site is located along the length of the interconnect at an extrusion site distance ($L_{extrusion}$) from the first via and between the first via and the second via. An extrusion of the interconnect at the extrusion site short-circuits the interconnect to the extrusion monitor structure. A resistance meter is coupled between the first via and the second via for measuring a resistance ($R_{total}$) between the first via and the second via. The extrusion site distance ($L_{extrusion}$) is then determined from the following relationship:

$$R_{total}=(\rho_i/h_i)*(L_{extrusion}/w_i)+(\rho_m/h_m)*((L_v-L_{extrusion})/w_m).$$

In another embodiment of the invention, the interconnect and the extrusion monitor structure are comprised of a same material such that the resistivity ($\rho_i$) of the interconnect is substantially same as the resistivity ($\rho_m$) of the extrusion monitor structure. In addition, the height ($h_i$) of the interconnect is substantially same as the height ($h_m$) of the extrusion monitor structure. In that case, the extrusion site distance ($L_{extrusion}$) is determined as follows:

$$L_{extrusion}=(w_i/(w_m-w_i))*(R_{total}*h_iw_m/\rho_i-L_v).$$

In this manner, the location of the extrusion site along the length of the interconnect is determined electrically by measuring the resistance between the first via and the second via for an easy and accurate technique of determining the location of the extrusion site. Thus, the time-consuming hit-or-miss technique of polishing down to the extrusion site for locating the extrusion visually in the prior art is avoided.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 8:
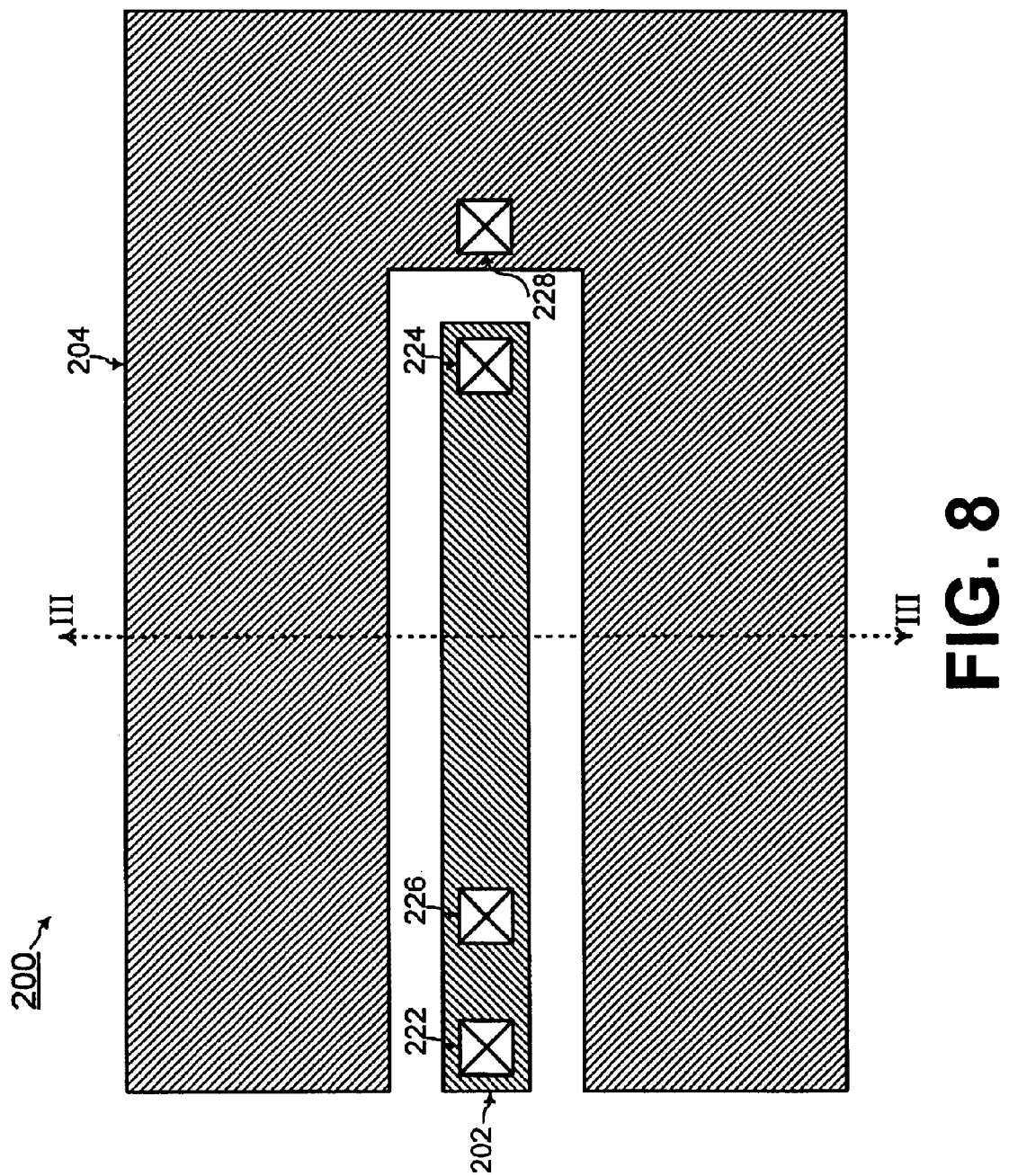
FIG. 8 shows a system for electrically determining the location of the extrusion site along a length of an interconnect, including a top view of an extrusion monitor structure formed to surround the interconnect and including first and second vias formed to the interconnect and the extrusion monitor structure, according to an embodiment of the present invention.
Figure 9:
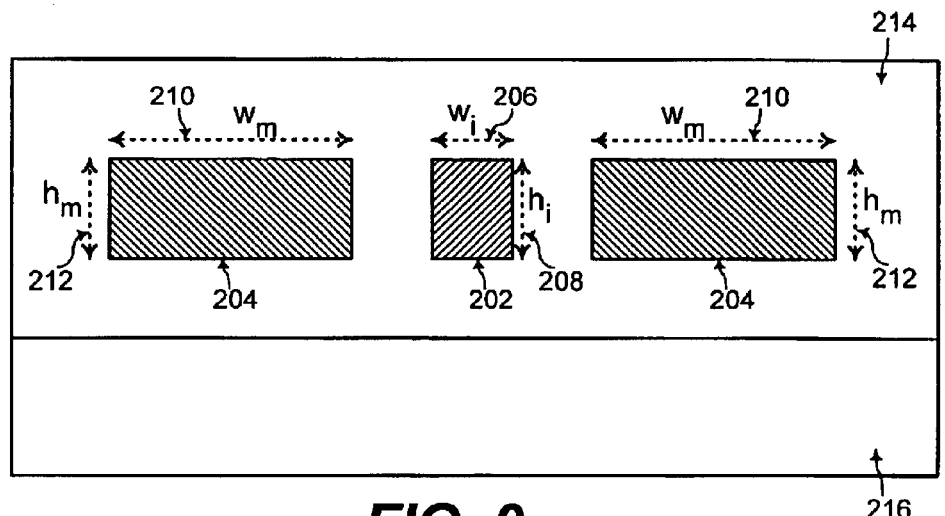
FIG. 9 shows a cross-sectional view of the interconnect and the extrusion monitor structure of FIG. 8 across line II—II, according to an embodiment of the present invention.

Referring to FIG. 8, a system 200 of the present invention is used to electrically determine a location of an extrusion site along a length of an interconnect 202. FIG. 8 shows a top view of the system 200 that includes an extrusion monitor structure 204 that surrounds the sides the interconnect 202 along the length of the interconnect. FIG. 9 shows a cross-sectional view of the interconnect 202 and the extrusion monitor structure 204 of FIG. 8 along line II—II. Referring to FIG. 9, the interconnect 202 has a width ($w_i$) 206 and a height ($h_i$) 208, and the extrusion monitor structure 204 has a width ($w_m$) 210 and a height ($h_m$) 212.

In one embodiment of the present invention, the height ($h_i$) 208 of the interconnect 202 is substantially same as the height ($h_m$) 212 of the extrusion monitor structure 204. On the other hand, the width ($w_m$) 210 of the extrusion monitor structure 204 is substantially larger such as at least ten times larger than the width ($w_i$) 206 of the interconnect 202. Such a substantially larger width ($w_m$) 210 of the extrusion monitor structure 204 ensures that the current density through the extrusion monitor structure 204 is limited such that an extrusion is not likely to occur from the extrusion monitor structure 204. Thus, the extrusion that occurs from the interconnect 202 and not the extrusion monitor structure 204 is characterized in this manner.

In addition, the material comprising the interconnect 202 determines a resistivity ($\rho_i$) of the interconnect 202, and the material comprising the extrusion monitor structure 204 determines a resistivity ($\rho_m$) of the extrusion monitor structure 204. In one embodiment of the present invention, the interconnect 202 and the extrusion monitor structure 204 are comprised of the same material such as copper for example such that the resistivity ($\rho_i$) of the interconnect 202 is substantially same as the resistivity ($\rho_m$) of the extrusion monitor structure 204.

Further referring to FIG. 9, the interconnect 202 and the extrusion monitor structure 204 are formed to be surrounded by a dielectric material 214 on a semiconductor substrate 216. Thus, the dielectric material 214 separates the interconnect 202 from the extrusion monitor structure 204. The semiconductor substrate 216 is comprised of silicon, and the dielectric material 214 is comprised of a low-K dielectric material, according to one embodiment of the present invention.

The low-K dielectric material 214 is advantageous for lower capacitance between the interconnect structures as the distance between the interconnect structures is decreased. Such lower capacitance results in higher speed performance of the integrated circuit and also in lower power dissipation. In addition, such lower capacitance results in lower cross-talk between the interconnect structures. Lower cross-talk between interconnect structures is especially advantageous when the interconnect structures are disposed closer together as device density continually increases. However, the dielectric material 214 with low-K typically is softer (i.e., has lower density) and may even be porous. Thus, an extrusion is more likely to form through such low-K dielectric material 214 that may be characterized with the system 200 of FIG. 8.

Further referring to FIG. 8, a first end via 222 is formed to be coupled to a first end of the interconnect 202, and a second end via 224 is formed to be coupled to a second end of the interconnect 202. In addition, a first via 226 is formed to be coupled to the interconnect at a first via location between the ends of the interconnect, and a second via 228 is formed to be coupled to the extrusion monitor structure 204 at a second via location. Techniques for forming a via to be coupled to an interconnect structure in general are known to one of ordinary skill in the art of integrated circuit fabrication.

Figure 10:
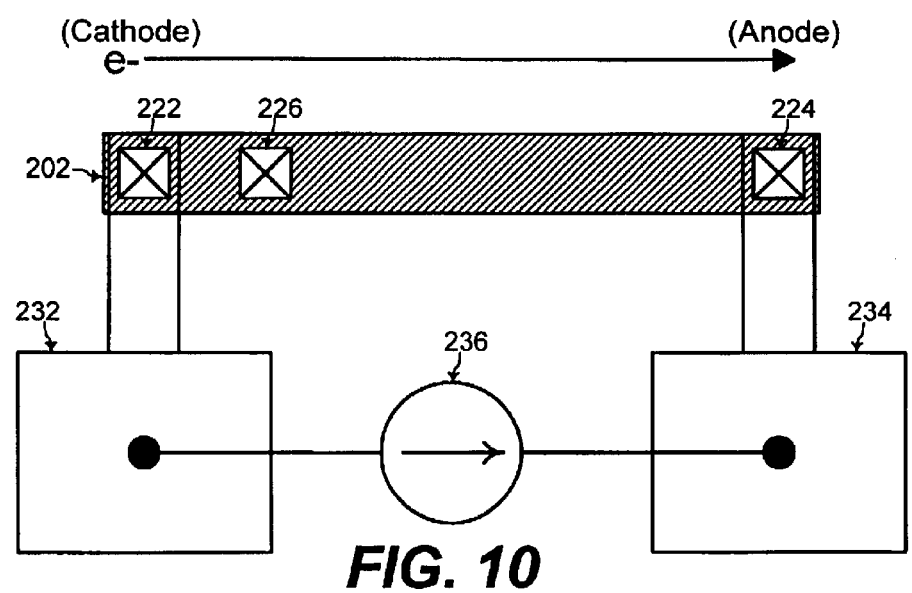
FIG. 10 shows a current source for providing current through the interconnect for causing an extrusion to occur from the interconnect, according to an embodiment of the present invention.

Referring to FIG. 10, a first test pad 232 is coupled to the first end via 222, and a second test pad 234 is coupled to the second end via 224. A current source 236 is coupled between the first and second test pads 232 and 234 and thus to the first and second end vias 222 and 224. The current source 236 provides a current flowing through the interconnect 202. Such a current source 236 individually is known to one of ordinary skill in the art of electronics. When electrons from such current flow from the first end via 222 toward the second end via 224, the first end via 222 acts as a cathode end, and the second end via 224 acts as an anode end for the interconnect 202.

Figure 11:
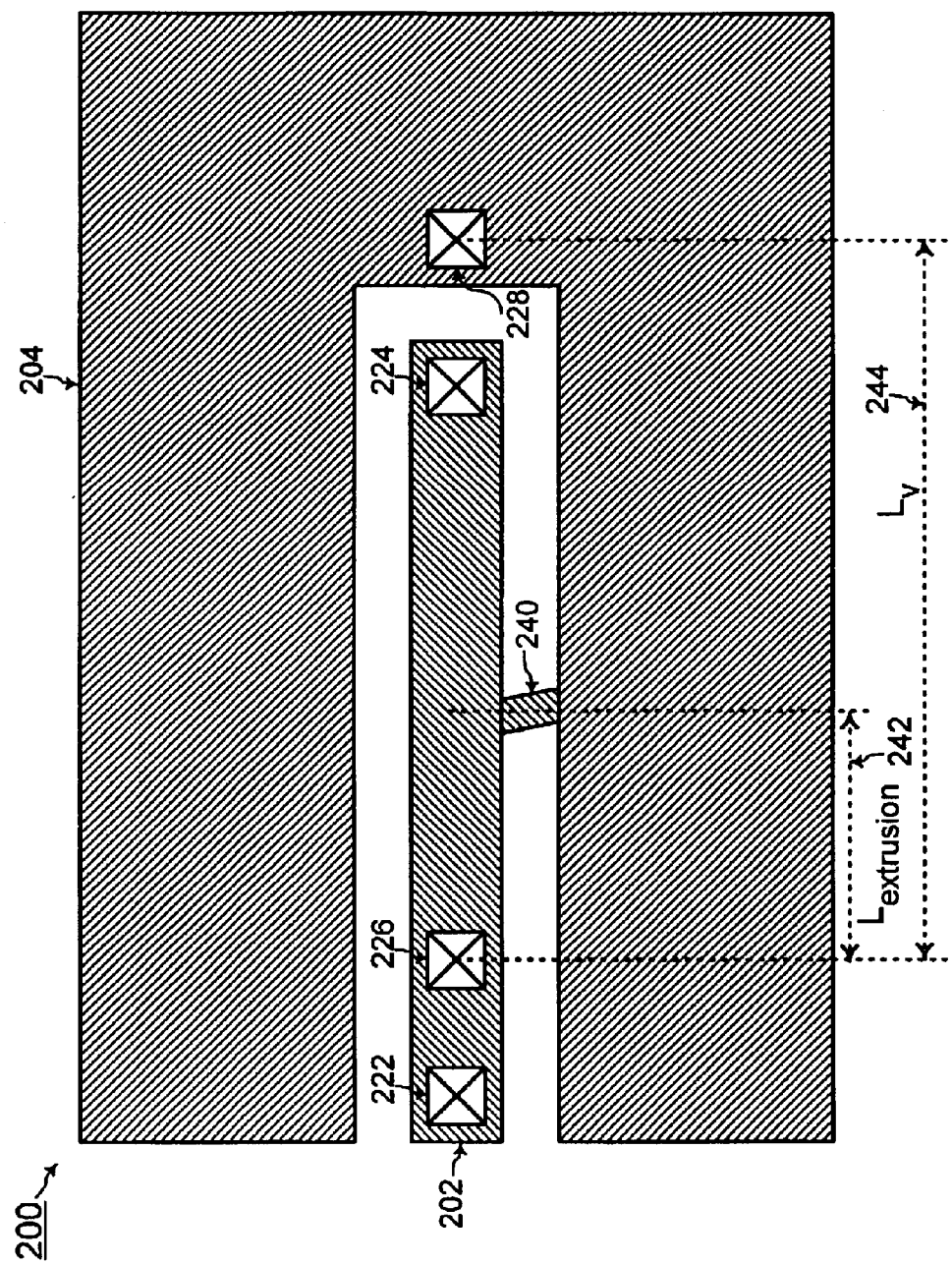
FIG. 11 shows the top view of the interconnect and the extrusion monitor structure of FIG. 8 with formation of an extrusion that short-circuits the interconnect to the extrusion monitor structure.

Referring to FIGS. 10 and 11, when the current density through the interconnect 202 is sufficiently high, an extrusion 240 occurs from flux divergence of material of the interconnect 202 at an extrusion site along the length of the interconnect 202. The extrusion 240 short-circuits the interconnect 202 to the extrusion monitor structure 204 that surrounds the sides of the interconnect 202 along the length of the interconnect 202. The extrusion site of the extrusion 240 is located between the first via 226 on the interconnect 202 and the second via 228 on the extrusion monitor structure 204.

Figure 1:
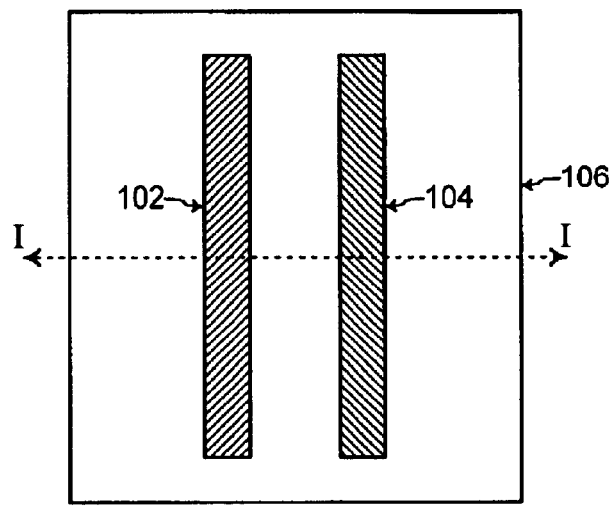
FIG. 1 shows a top view of two metal lines surrounded by dielectric material on a semiconductor substrate, according to the prior art.

Further referring to FIG. 1, the extrusion site of the extrusion 240 is located along the length of the interconnect 202 at an extrusion site distance ($L_{extrusion}$) 242 from the first via 226. In addition, the first via 226 on the interconnect 202 and the second via 228 on the extrusion monitor structure 204 are separated by a via distance ($L_v$) 244.

Figure 12:
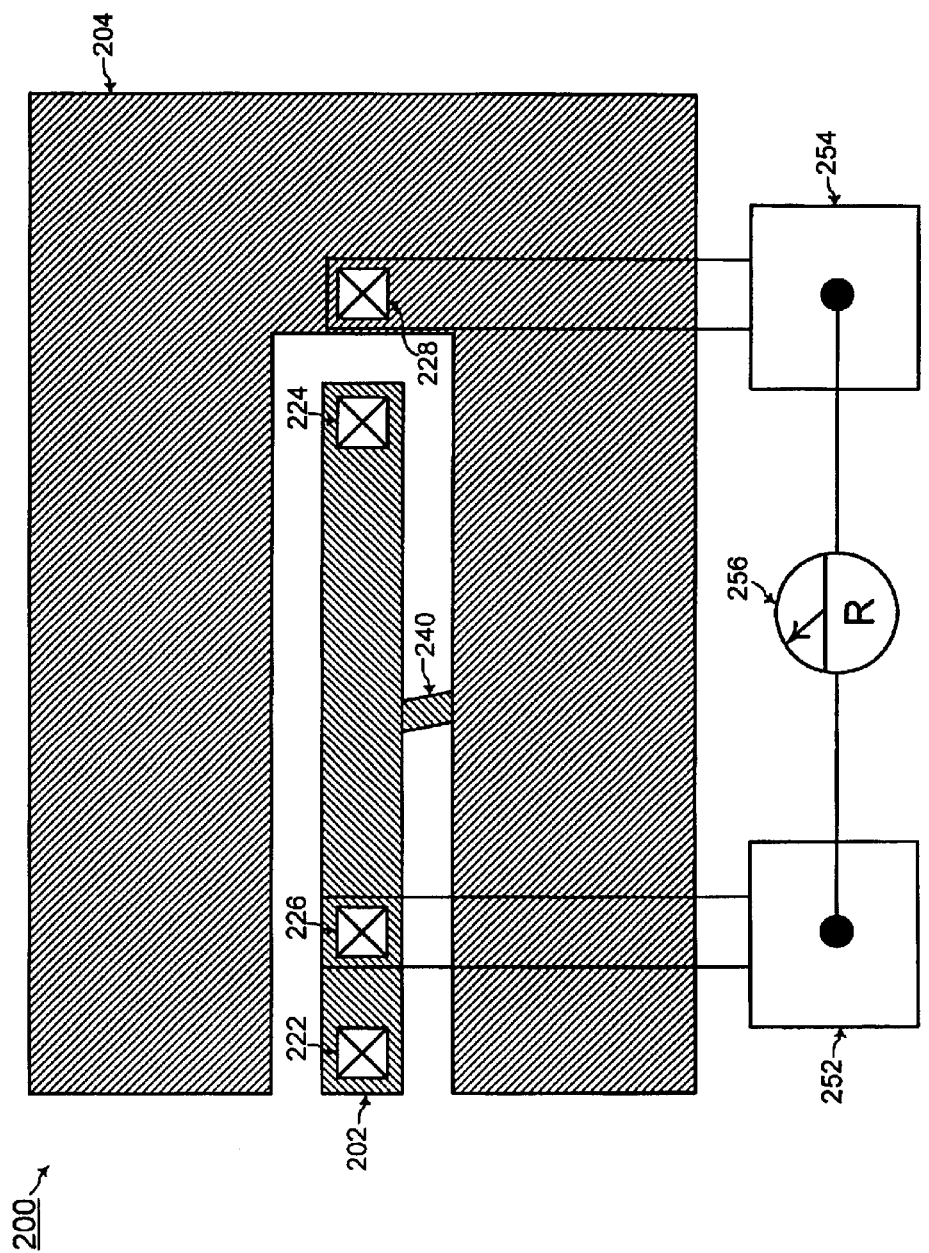
FIG. 12 shows a resistance monitor for measuring a resistance between the first and second vias after formation of the extrusion of FIG. 11, according to an embodiment of the present invention.

Referring to FIG. 12, the system 200 further comprises a resistance meter 256 coupled between a first test pad 252 and a second test pad 254. The first test pad 252 is coupled to the first via 226 on the interconnect 226, and the second test pad 254 is coupled to the second via 228 on the extrusion monitor structure 204. Thus, the resistance meter 256 is coupled between and measures the resistance ($R_{total}$) between the first via 226 on the interconnect 226 and the second via 228 on the extrusion monitor structure 204. Such a resistance meter 256 individually is known to one of ordinary skill in the art of electronics.

With such a measurement of the resistance ($R_{total}$) between the first via 226 on the interconnect 226 and the second via 228 on the extrusion monitor structure 204, the extrusion site distance ($L_{extrusion}$) 242 for the extrusion 240 from the first via 226 is then determined from the following relationship:

$$R_{total}=(\rho_i/h_i)*(L_{extrusion}/w_i)+(\rho_m/h_m)*((L_v-L_{extrusion})/w_m),$$

with the variables, $\rho_i$, $h_i$, $L_{extrusion}$, $w_i$, $\rho_m$, $h_m$, $L_v$, and $w_m$ being already described herein.

Note that in one embodiment of the present invention, the width ($w_m$) of the extrusion monitor structure 204 is significantly larger (such as at least ten times larger for example) than the width ($w_i$) of the interconnect 202. When the width ($w_m$) of the extrusion monitor structure 204 is significantly larger than the width ($w_i$) of the interconnect 202, the contribution of resistance from the extrusion monitor structure 204 to the value of the measured resistance ($R_{total}$) between the first via 226 and the second via 228 is significantly less than the contribution of resistance from the relevant portion of the interconnect 202 between the first via 226 and the site of the extrusion 240. Thus, with such a structural condition, the measured resistance ($R_{total}$) is more sensitive to the site of the extrusion 240 such that the resistance ($R_{total}$) is more indicative of the site of the extrusion 240.

In one embodiment of the present invention, the height ($h_i$) 208 of the interconnect 202 is substantially same as the height ($h_m$) 212 of the extrusion monitor structure 204, and the interconnect 202 and the extrusion monitor structure 204 are comprised of the same material such as copper for example such that the resistivity ($\rho_i$) of the interconnect 202 is substantially same as the resistivity ($\rho_m$) of the extrusion monitor structure 204. In that case, the extrusion site distance ($L_{extrusion}$) for the extrusion 240 from the first via 226 is determined as follows:

$$L_{extrusion}=(w_i/(w_m-w_i))*(R_{total}*h_i*w_m/\rho_i-L_v).$$

In this manner, the location of the extrusion site along the length of the interconnect 202 is determined electrically by measuring the resistance ($R_{total}$) between the first via 226 on the interconnect 226 and the second via 228 on the extrusion monitor structure 204 for an easy and accurate technique of determining the location of the extrusion site. Thus, the time-consuming hit-or-miss technique of polishing down to the extrusion for locating the extrusion visually in the prior art is avoided. Such a technique of electrically determining the location of the extrusion site along the length of the interconnect 202 may advantageously be used for characterizing a process for integrated circuit fabrication such as for various types of material for the interconnect 202 or for the low-K dielectric material 214.

Figure 2:
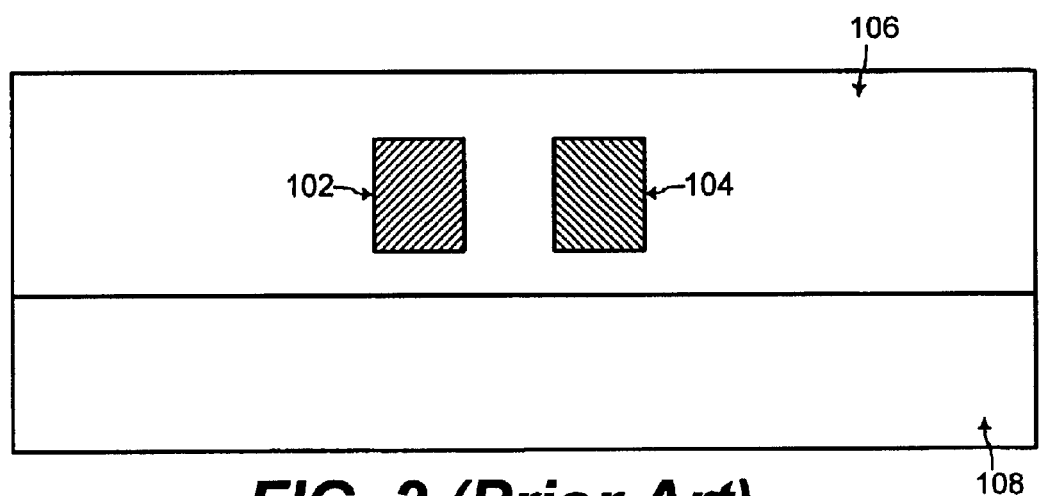
FIG. 2 shows a cross-sectional view of the two metal lines of FIG. 1 across line I—I, according to the prior art.
Figure 3:
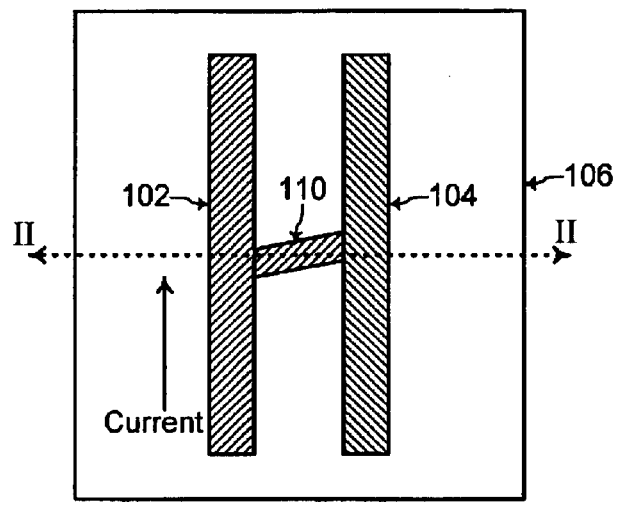
FIG. 3 shows an extrusion of metal from a first metal line short-circuiting to a second metal line in FIG. 1, according to the prior art.
Figure 4:
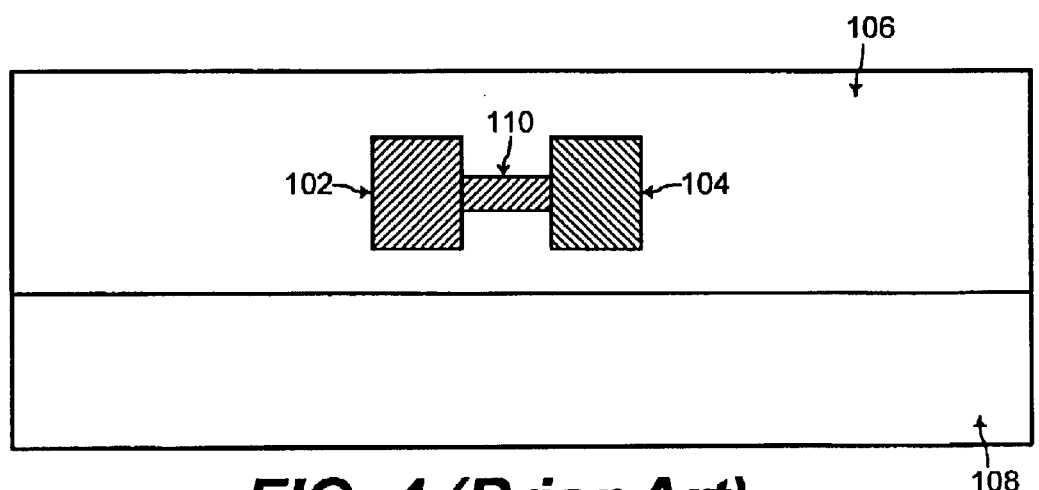
FIG. 4 shows a cross-sectional view across the extrusion of FIG. 3, according to the prior art.
Figure 5:
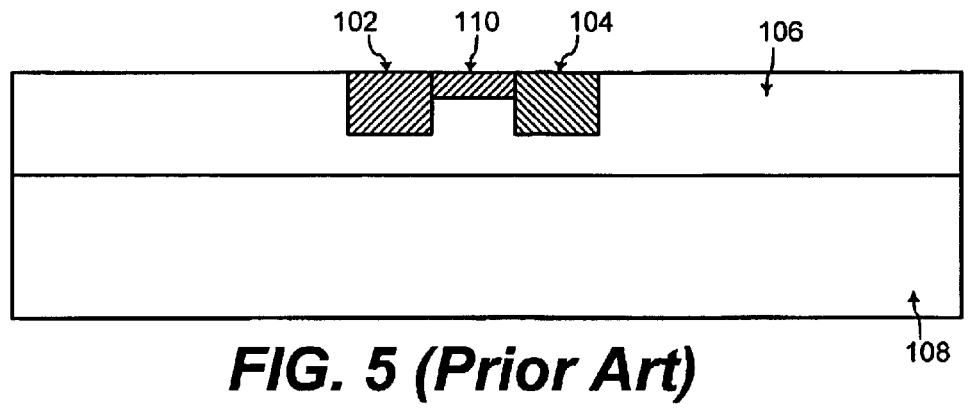
FIG. 5 shows a cross-sectional view across the extrusion of FIG. 3 with polishing down of materials until the extrusion is exposed for visually determining the location of the extrusion, according to the prior art.
Figure 6:
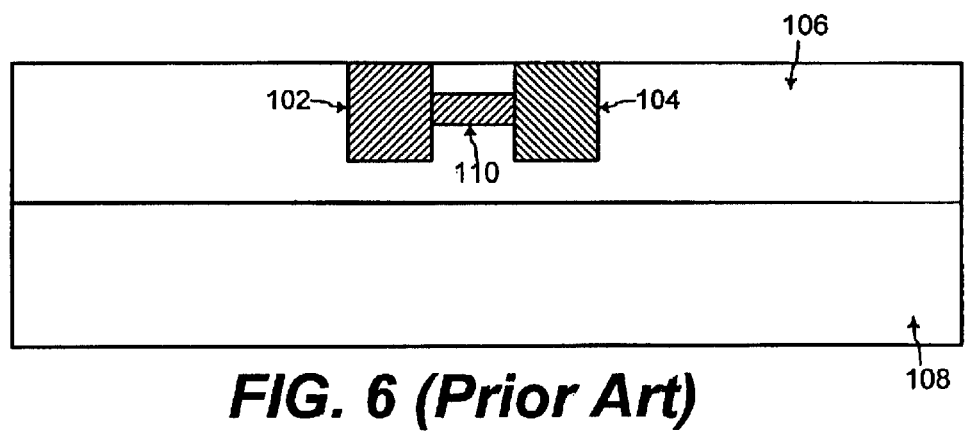
FIG. 6 shows the cross-sectional view of FIG. 5 when the materials on the semiconductor substrate are not polished down enough such that the location of the extrusion cannot be visually determined, according to the prior art.
Figure 7:
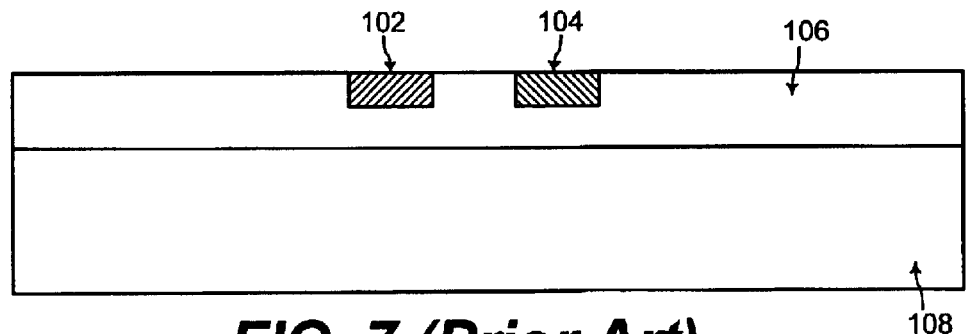
FIG. 7 shows the cross-sectional view of FIG. 5 when the materials on the semiconductor substrate are polished down too much such that the location of the extrusion cannot be visually determined, according to the prior art.
Figure 13:
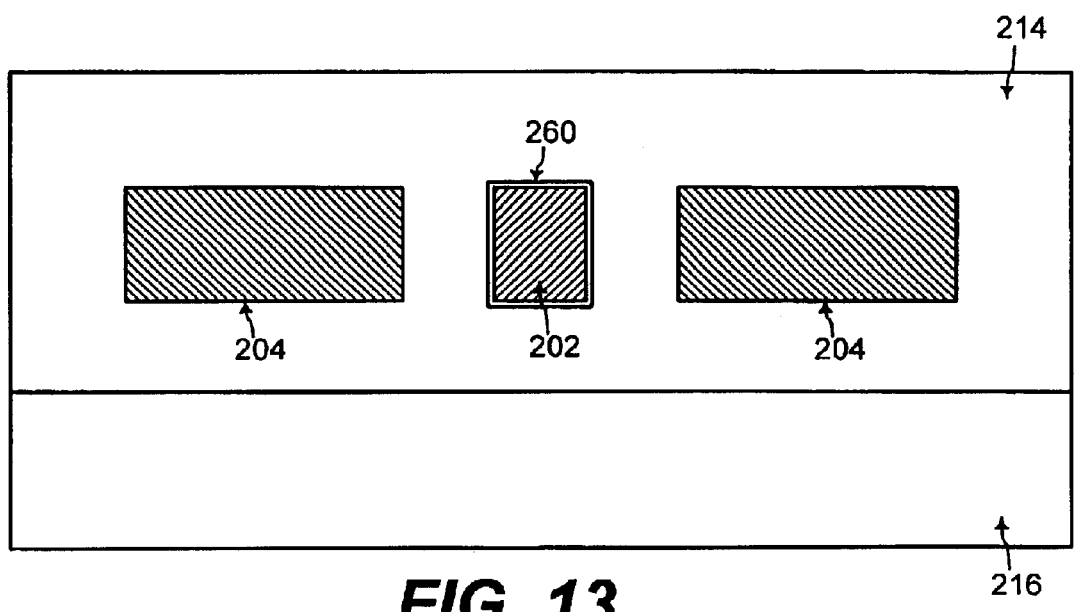
FIG. 13 shows the cross-sectional view of the interconnect and the extrusion monitor structure of FIG. 8 across line II—II when the interconnect is surrounded by a diffusion barrier material, according to another embodiment of the present invention.

In addition, referring to FIG. 13, the interconnect 202 may be formed to be surrounded by a diffusion barrier material 260, especially when the interconnect 202 is comprised of copper for preventing diffusion of copper from the interconnect 202 into the surrounding dielectric material 214. As device dimensions are further scaled down, the thickness of the diffusion barrier material 260 is decreased to maximize the volume of the interconnect 202 and in turn to minimize the resistance of the interconnect 202. However, as the diffusion barrier material 260 becomes thinner, extrusion of material of the interconnect 202 is more probable. Thus, the system 200 of FIG. 2 may advantageously be used for characterizing such extrusion of the interconnect 202 for various types and thicknesses of the diffusion barrier material 260 surrounding the interconnect 202.

The foregoing is by way of example only and is not intended to be limiting. Any specified material or any specified dimension of any structure described herein is by way of example only. For example, the present invention may be practiced when the interconnect 202 and the extrusion monitor structure 204 are comprised of various types of conductive material and are comprised of same or different conductive materials from each-other, as would be apparent to one of ordinary skill in the art of integrated circuit fabrication from the description herein. In addition, the present invention may be practiced when the interconnect 202 and the extrusion monitor structure 204 have same or different heights, as would be apparent to one of ordinary skill in the art of integrated circuit fabrication from the description herein.

In addition, as will be understood by those skilled in the art, the structures described herein may be made or used in the same way regardless of their position and orientation. Accordingly, it is to be understood that terms and phrases such as "top," "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A system for locating an extrusion from an interconnect, comprising:

an extrusion monitor structure surrounding the interconnect and being separated from the interconnect by a dielectric material;

a first via coupled to the interconnect, and a second via coupled to the extrusion monitor structure and separated from the first via by a via distance ($L_v$), wherein the extrusion is located at an extrusion site distance ($L_{extrusion}$) from the first via and between the first and second vias to short-circuit the interconnect to the extrusion monitor structure; and a resistance meter for measuring a resistance ($R_{total}$) between the first and second vias, wherein the $L_{extrusion}$ is determined from a relationship with $R_{total}$, $L_v$, and resistivities and dimensions of the interconnect and the extrusion monitor structure, and wherein a width ($w_m$) of the extrusion monitor structure portion running aside a length of the interconnect is larger than a width ($w_i$) of the interconnect such that the resistance ($R_{total}$) varies depending on the extrusion site distance ($L_{extrusion}$).

2. The system of claim 1, wherein the interconnect has the width ($w_i$), a resistivity ($\rho_i$), and a height ($h_i$), and wherein the extrusion monitor structure has the width ($w_m$), a resistivity ($\rho_m$), and a height ($h_m$), and wherein the $L_{extrusion}$ is determined from the following relationship:

$$R_{total}=(\rho_i/h_i)*(L_{extrusion}/w_i)+(\rho_m/h_m)*((L_v-L_{extrusion})/w_m).$$

3. The system of claim 2, wherein the interconnect and the extrusion monitor structure have a substantially same resistivity ($\rho_i$) and a substantially same height ($h_i$), and wherein the extrusion site distance ($L_{extrusion}$) is determined as follows:

$$L_{extrusion}=(w_i/(w_m-w_i))*(R_{total}*h_i*w_m/\rho_i-L_v).$$

4. The system of claim 1, further comprising:

a current source for providing a current through the interconnect that causes the extrusion to occur at the extrusion site.

5. The system of claim 1, wherein the interconnect and the extrusion monitor structure are comprised of a same material and have a substantially same resistivity.

6. The system of claim 1, wherein the interconnect and the extrusion monitor structure are comprised of copper.

7. The system of claim 1, wherein the interconnect and the extrusion monitor structure have a substantially same height.

8. The system of claim 1, wherein the width ($w_m$) of the extrusion monitor structure running aside the length of the interconnect is at least ten times larger than the width ($w_i$) of the interconnect.

9. The system of claim 1, wherein the dielectric material between the interconnect and the extrusion monitor structure is a low-K dielectric material.

10. The system of claim 1, wherein the interconnect is surrounded by a diffusion barrier material.

11. A method for locating an extrusion from an interconnect, comprising:

forming an extrusion monitor structure that surrounds the interconnect and that is separated from the interconnect by a dielectric material;

forming a first via coupled to the interconnect, and a second via coupled to the extrusion monitor structure and separated from the first via by a via distance ($L_v$), wherein the extrusion is located at an extrusion site distance ($L_{extrusion}$) from the first via and between the first and second vias to short-circuit the interconnect to the extrusion monitor structure; and measuring a resistance ($R_{total}$) between the first and second vias, wherein the $L_{extrusion}$ is determined from a relationship with $R_{total}$, $L_v$, and resistivities and dimensions of the interconnect and the extrusion monitor structure, and wherein a width ($w_m$) of the extrusion monitor structure portion running aside a length of the interconnect is larger than a width ($w_i$) of the interconnect such that the resistance ($R_{total}$) varies depending on the extrusion site distance ($L_{extrusion}$).

12. The method of claim 11, wherein the interconnect has the width ($w_i$), a resistivity ($\rho_i$), and a height ($h_i$), and wherein the extrusion monitor structure has the width ($w_m$), a resistivity ($\rho_m$), and a height ($h_m$), and wherein the $L_{extrusion}$ is determined from the following relationship:

$$R_{total}=(\rho_i/h_i)*(L_{extrusion}/w_i)+(\rho_m/h_m)*((L_v-L_{extrusion})/w_m).$$

13. The method of claim 12, wherein the interconnect and the extrusion monitor structure have a substantially same resistivity ($\rho_i$) and a substantially same height ($h_i$), and wherein the extrusion site distance ($L_{extrusion}$) is determined as follows:

$$L_{extrusion}=(w_i/(w_m-w_i))*(R_{total}*h_i*w_m/\rho_i-L_v).$$

14. The method of claim 11, further including the step of:

conducting a current through ends of the interconnect to cause the extrusion to occur at the extrusion site.

15. The method of claim 11, wherein the interconnect and the extrusion monitor structure are comprised of a same material and have a substantially same resistivity.

16. The method of claim 11, wherein the interconnect and the extrusion monitor structure are comprised of copper.

17. The method of claim 11, wherein the interconnect and the extrusion monitor structure are formed to have a substantially same height.

18. The method of claim 11, wherein the extrusion monitor structure running aside the length of the interconnect is formed to have the width ($w_m$) that is at least ten times larger than the width ($w_i$) of the interconnect.

19. The method of claim 11, further including the step of:

forming a low-K dielectric material between the interconnect and the extrusion monitor structure.

20. The method of claim 11, further including the step of:

forming a diffusion barrier material that surrounds the interconnect.

* * * * *